(12) United States Patent
Yamasawa et al.

(10) Patent No.: US 10,458,041 B2
(45) Date of Patent: Oct. 29, 2019

(54) ALUMINA SUBSTRATE

(71) Applicant: TDK CORPORATION, Tokyo (JP)

(72) Inventors: Kazuhito Yamasawa, Tokyo (JP); Atsushi Ohido, Tokyo (JP); Katsumi Kawasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/554,109

(22) PCT Filed: Mar. 2, 2016

(86) PCT No.: PCT/JP2016/056431
§ 371 (c)(1),
(2) Date: Aug. 28, 2017

(87) PCT Pub. No.: WO2016/152422
PCT Pub. Date: Sep. 29, 2016

(65) Prior Publication Data
US 2018/0038011 A1    Feb. 8, 2018

(30) Foreign Application Priority Data
Mar. 23, 2015  (JP) .................. 2015-059234

(51) Int. Cl.
C30B 29/40    (2006.01)
C30B 25/20    (2006.01)
(Continued)

(52) U.S. Cl.
CPC ............. *C30B 25/20* (2013.01); *C30B 5/02* (2013.01); *C30B 19/12* (2013.01); *C30B 29/20* (2013.01);
(Continued)

(58) Field of Classification Search
CPC ......... C30B 29/40; C30B 25/02; C30B 19/08; C30B 19/02; C30B 9/12; C30B 1/10;
(Continued)

(56) References Cited

U.S. PATENT DOCUMENTS 8,698,168 B2 *   4/2014   Ueta .................. H01L 21/0237
                                                257/103
2010/0255304 A1 * 10/2010  Amano ................ C30B 23/00
                                                428/397

(Continued)

FOREIGN PATENT DOCUMENTS

JP          2009-190960 A       8/2009
JP           4457576 B2          4/2010
(Continued)

OTHER PUBLICATIONS

Lorenz et al., "Optical doping of AlN by rare earth implantation", Nuclear Instruments and Methods in Physics Research B, vol. 242, 2006, pp. 307-310. (Year: 2006).*

(Continued)

*Primary Examiner* — Jonathan C Langman
(74) *Attorney, Agent, or Firm* — Oliff PLC

(57) ABSTRACT

An alumina substrate on which an AlN layer is formed and that causes less warping, and a substrate material strong enough to withstand normal handling when an AlN crystal is grown upon it, and prevents cracking and fracturing of a grown crystal when stress is applied during growing or cooling. The substrate has a gap and a rare earth element-containing region inside the AlN layer or at the interface between the AlN layer and the alumina substrate. Warping of the AlN layer can be reduced by lattice-mismatch stress being concentrated at the region and releasing of stress by the gap. The region having a concentrating of stress, and the gap having a low mechanical strength, can induce crackings and fracturings. As a result, contamination of crackings and (Continued)

fracturings into the crystal grown on the substrate can be prevented. The region can ensure a level of mechanical strength sufficient for handling.

18 Claims, 5 Drawing Sheets

(51) Int. Cl.
| | |
|---|---|
| *C30B 19/12* | (2006.01) |
| *C30B 29/20* | (2006.01) |
| *H01L 21/02* | (2006.01) |
| *C30B 5/02* | (2006.01) |
| *C30B 1/02* | (2006.01) |
| *C30B 9/12* | (2006.01) |
| *H01L 21/205* | (2006.01) |
| *C30B 25/02* | (2006.01) |
| *C30B 19/08* | (2006.01) |
| *C30B 19/02* | (2006.01) |
| *C30B 1/10* | (2006.01) |

(52) U.S. Cl.
CPC ............ *C30B 29/40* (2013.01); *C30B 29/403* (2013.01); *H01L 21/0254* (2013.01); *H01L 21/02491* (2013.01); *H01L 21/02499* (2013.01); *H01L 21/02502* (2013.01); *C30B 1/02* (2013.01); *C30B 1/10* (2013.01); *C30B 9/12* (2013.01); *C30B 19/02* (2013.01); *C30B 19/08* (2013.01); *C30B 25/02* (2013.01); *H01L 21/0242* (2013.01); *H01L 21/02628* (2013.01); *H01L 21/205* (2013.01)

(58) Field of Classification Search
CPC .. C30B 1/02; C30B 29/20; C30B 5/02; C30B 19/12; H01L 21/0254; H01L 21/02502; H01L 21/02499; H01L 21/02491; H01L 21/0242; H01L 21/02628; H01L 21/205
See application file for complete search history.

(56) References Cited

U.S. PATENT DOCUMENTS

| 2011/0094438 A1 | 4/2011 | Koukitu et al. | |
| 2014/0008609 A1* | 1/2014 | Chiu | H01L 33/24 257/13 |
| 2017/0213938 A1* | 7/2017 | Bae | H01L 33/22 |
| 2017/0331000 A9* | 11/2017 | Park | H01L 33/06 |

FOREIGN PATENT DOCUMENTS

| JP | 5324110 B2 | 10/2013 | | |
| JP | 2014-101235 A | 6/2014 | | |
| WO | 2009/090923 A1 | 7/2009 | | |
| WO | WO2016010270 | * | 1/2016 | H01L 33/22 |

OTHER PUBLICATIONS

May 31, 2016 International Search Report issued in International Patent Application No. PCT/JP2016/056431.
Tajima et al., "Controlled Formation of Voids at the AlN/Sapphire Interface by Sapphire Decomposition for Self-Separation of the AlN Layer," Phys. Status Soidi C6, No. S2, S447-S450 (2009).
Jadwisienczak, W. M. et al., "Visible emission from AlN doped with Eu and Tb ions," Journal of Applied Physics, American Institute of Physics, Mar. 30, 2001, vol. 89, No. 8, pp. 4384-4390.
Lorenz, K., "Optical doping of AlN by rare earth implantation," Nuclear Instruments & Methods in Physics Research. Section B, Beam interactions with materials and a, North-Holland 242 (1-2), pp. 307-310.
Mackenzie, J.D., Er doping of III-nitrides during growth by metalorganic molecular beam epitaxy, Journal of Crystal Growth, vol. 175-176, pp. 84-88.

* cited by examiner

ALUMINA SUBSTRATE

The present invention related to an alumina substrate having an aluminum nitride layer disposed on a main surface thereof.

BACKGROUND

In the present invention, a substrate made by α-alumina ($Al_2O_3$) single crystal (hereinafter, it is called as sapphire) is called as sapphire substrate, and a substrate made by polycrystalline alumina ($Al_2O_3$) is called as polycrystalline alumina substrate. The sapphire substrate and the polycrystalline alumina substrate are both called as alumina substrate.

A crystalline layer made of a group III nitride semiconductor such as gallium nitride (GaN), aluminum nitride (AlN) or aluminum gallium nitride (AlGaN) or the like is noted as a functional layer constituting a light emitting device and a power transistor of a light emitting diode or a laser diode or the like which emit a short-wavelength light in the range of blue band to ultraviolet band. Further, AlN is also a material which can be expected to be used as a heat dissipation material making use of the high thermal conductivity.

As the forming method of these crystalline layers, a method is proposed in which multi-layered semiconductor thin-film layers are deposited using vapor deposition methods such as molecular beam epitaxy method or metal organic chemical vapor deposition method or the like on a substrate of such as sapphire or SiC single crystal or the like. Especially, a sapphire substrate is an excellent substrate material from the viewpoint of size, supplying capability and cost. However, there is some discrepancy between the lattice constants or the thermal expansion coefficients of the substrate material and the semiconductor thin-film layer because of the different constituent elements, composition ratios or crystalline structures. Due to the discrepancy, internal stress will be produced during the forming process of the semiconductor thin-film layer. As a result, defects or deformation with high density will be introduced to bring decrease in the energy efficiency of the semiconductor element, shortening in the lifetime of the element, inferiority in the property and reduction of yield due to cracking.

Thus, substrates with same materials which are excellent in lattice-match are discussed. For example, respect to the semiconductor thin-film layer of AlGaN containing large amount of Al, AlN single crystal is discussed to be used as the substrate. That is, sublimation methods on the substrates of sapphire or SiC single crystal, vapor deposition methods such as hydride vapor deposition method (HVPE) or the like, or methods in which AlN crystal is made by flux method and a semiconductor thin-film layer of AlGaN is formed on the AlN single crystal. In this case, in order to eliminate the influence of the substrate of sapphire or SiC single crystal or the like which is the base, it is desired to eliminate the sapphire or the SiC single crystal or the like by milling to obtain an independent substrate of AlN single crystal and then deposit a semiconductor thin-film layer of AlGaN on the independent substrate. In order to obtain an independent substrate, the AlN single crystal should be grown to a thickness of 100 μm or more. However, due to the growth on different substrates, internal distortions are accumulated; defects, crackings or warping are included. As a result, influence is brought to the semiconductor thin-film layer of AlGaN which is deposited on the substrate and a semiconductor thin-film layer of AlGaN cannot be formed with sufficient quality in production at last.

As the countermeasure, a method of further growing an AlN single crystal on the independent substrate is proposed. By this method, the quality is expected to be improved; but the process is complex so that the cost is increased. Thus, there is a problem that the utility value in the industry is decreased.

On the other hand, a method is proposed in which AlN single crystal is formed on the substrate of sapphire or SiC single crystal or the like after substances or gaps with different properties from the AlN single crystal are sandwiched in a layer shape and/or a region shape. In such a structure, the internal stress can be suppressed and defect, warping, cracking or deformation can be decreased, or it will be easy to fabricate an independent substrate.

In Patent Document 1, a method is disclosed that a GaN or AlN single crystal is grown after a metal film containing titanium or vanadium is formed on the substrate with a moth-eaten appearance. In this way, GaN or AlN is grown from the moth-eaten part, and stress is released in the part where the metal film is formed.

In Patent Document 2, a method is disclosed in which a part of a substrate surface is decomposed by a thermal treatment in a reducing gas and ammonia gas after an AlN layer is formed on the sapphire substrate, and then gaps are formed at the interface between the substrate and the AlN layer. In the case that the AlN single crystal is grown after the treatment has been carried out, stress strain caused by lattice mismatch can be relaxed due to the void. In addition, when an excessive stress is produced, an independent substrate can be brought out by spontaneous peeling.

PATENT DOCUMENTS

Patent Document 1: JP-B-4457576
Patent Document 2: JP-B-5324110

SUMMARY

The inventors of the present invention have studied the substrate material which will be a seed crystal in order to obtain an AlN crystal with a higher quality. If the seed crystal is an AlN crystal, the constituent elements, the composition and the crystal structure are the same as the aim crystal, so no stress caused by lattice-mismatch or thermal expansion coefficient difference will be produced. An AlN crystal is expected to be used as the seed crystal from the viewpoint of suppressing the production of stress. However, if an AlN crystal containing too many defects is used in the seed crystal, the AlN crystal grown on it will also become a crystal with a lot of defects. Further, at the present time, a high quality AlN crystal substrate with a 4 size of 4 inches cannot be provided cheaply, largely and stably.

On the other hand, for example, sapphire substrate is a substrate which is excellent in quality, size, cost and supplying capability, but it is a different substance from AlN, so if an AlN crystal is grown on the sapphire substrate, stress caused by lattice-mismatch and thermal expansion coefficient difference will be introduced. Such a stress cannot be avoided as long as the substrate and the grown crystal are heterogeneous. In Patent documents 1 and 2, stress is decreased by sandwiching substances or gaps having different properties from the AlN between the substrate and the AlN layer. However, there still problems which should be solved in these methods.

Patent Document 1 is characterized by the growth of AlN single crystal from the places where no metal film containing titanium or vanadium is formed. However, the substrate which will be the base turns to be the one with different composition or crystal structure from AlN single crystal; thus, the generation of the defects caused by lattice-mismatch cannot be avoided. In addition, there is a problem that it is not applicable to grow the AlN single crystal at a high temperature, such as the temperature higher than the melting point of titanium or vanadium in the sublimation method.

In Patent Document 2, the decrease of warping in the grown AlN crystal as well as the separation of the AlN crystal and the sapphire used as the foundation substrate can be realized by utilizing the gaps. However, since the amount of the gaps and the strength of the substrate have contrary relation, the strength of the substrate will be reduced and it is hard to handle if the reduction of warping and the separation of the sapphire substrate are easily carried out by increasing the amount of the gaps. As shown in Examples of Patent Document 2, when the next process is conducted (i.e., the AlN crystal is grown) without touching the substrate at all after forming the gaps, large problems will not exist. However, in the case of treating as an independent substrate material, it is essential to handle, and thus it is essential to ensure the strength to a certain degree.

The aim of the present invention is to provide an alumina substrate comprising an AlN layer with decreased warping, and the alumina substrate with a degree of strength being capable of handling. Further, it aims to provide an alumina substrate in which the AlN crystal can be separated from the substrate in the case of applying an excessive stress caused by lattice-mismatch during the growing of the AlN crystal or the cooling process.

The present invention is made to solve the above technical problem. It is an alumina substrate characterized in that an AlN layer is formed on the surface of the alumina substrate and at least two kinds of structures, i.e., (a) rare earth element-containing regions and (b) gaps are contained in the interior of the AlN layer or the interface between the AlN layer and the alumina substrate. Thus, an alumina substrate formed with an AlN layer with decreased warping and strength to a degree of being capable of handling can be produced. In addition, the AlN crystal can be separated from the substrate in a state of preventing cracking and fracturing from mixing into the grown AlN crystal when an excessive stress caused by lattice-mismatch is applied thereto during the growth of the AlN crystal.

Further, the above alumina substrate is characterized in which the content of the rare earth elements is 1~10000 ppm based on Al element ratio. Thereby, warping can be more significantly decreased. Besides, cracking and fracturing can be more significantly prevented from occurring in the grown crystal.

Further, the above alumina substrate is characterized in which the thickness of the AlN layer is 0.02 μm to 100 μm. Thereby, crack or fracture can be more significantly prevented from occurring in the grown crystal.

Further, the above alumina substrate is characterized in which the alumina substrate is sapphire. Thereby, the alumina substrate can be used as a substrate material for a light emitting element or a semiconductor device.

Further, the above alumina substrate is characterized in which the AlN layer is mainly composed of single crystal. Thereby, the alumina substrate can be used as a substrate material for a light emitting element or a semiconductor device.

The alumina substrate of the present invention is a substrate formed with an AlN layer with decreased warping and having strength suitable for withstanding handling, and thus a semiconductor layer such as AlGaN or the like can be directly laminated.

When the alumina substrate of the present invention is used to grow AlN crystal, the AlN crystal can be easily grown since the AlN layer has been formed and warping has been decreased. In addition, the AlN crystal can be separated from the alumina substrate without crack or fracture occurring in the grown crystal when an excessive stress caused by lattice-mismatch is applied thereto during growing or cooling.

DETAILED DESCRIPTION OF EMBODIMENTS

The present invention is characterized by the structure in which gaps and rare earth element-containing regions are disposed in an interior of an AlN layer or at an interface between an AlN layer and an alumina substrate. The structure is described using FIG. 1A and FIG. 1B.

In the present embodiment, rare earth element refers to each element of Y and the lanthanide group. These elements have an ionic radius much bigger than Al, so the effect will be high when they are taken as the elements used in the regions for concentrating stress. Further, rare earth elements have characters that they can form the structure of the present embodiment more easily; further, they are substances which can withstand the AlN crystal growth in a higher temperature for being substances with a high melting point. The rare earth elements are not restricted to be one kind. Several kinds of rare earth elements can be used at the same time.

Figure 1A:
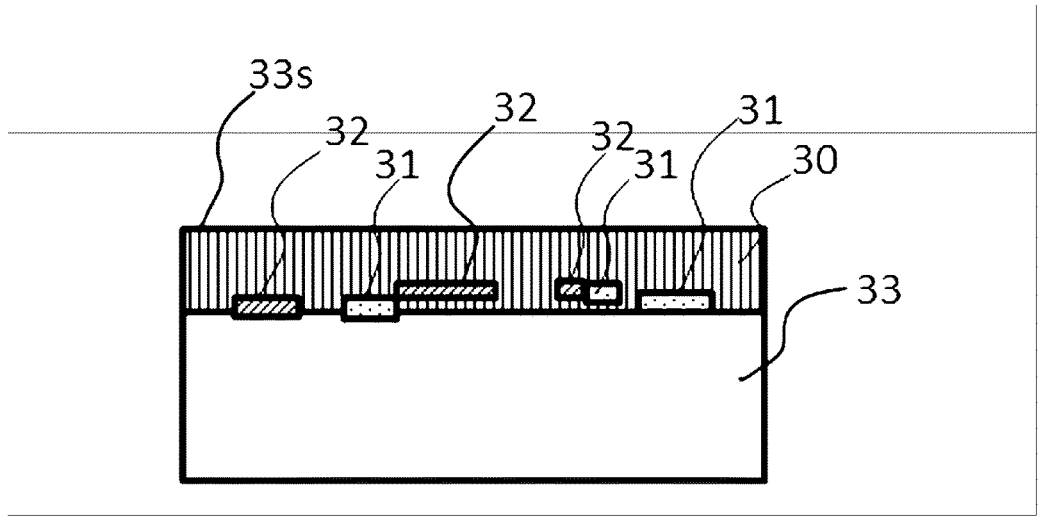
FIG. 1A is a schematic diagram showing the cross-section of an alumina substrate of the present embodiment, wherein gaps and rare earth elements-containing regions are formed in a dotted state in the way of being sandwiched by the interior of the AlN layer or the interface between the alumina substrate and the AlN layer.
Figure 1B:
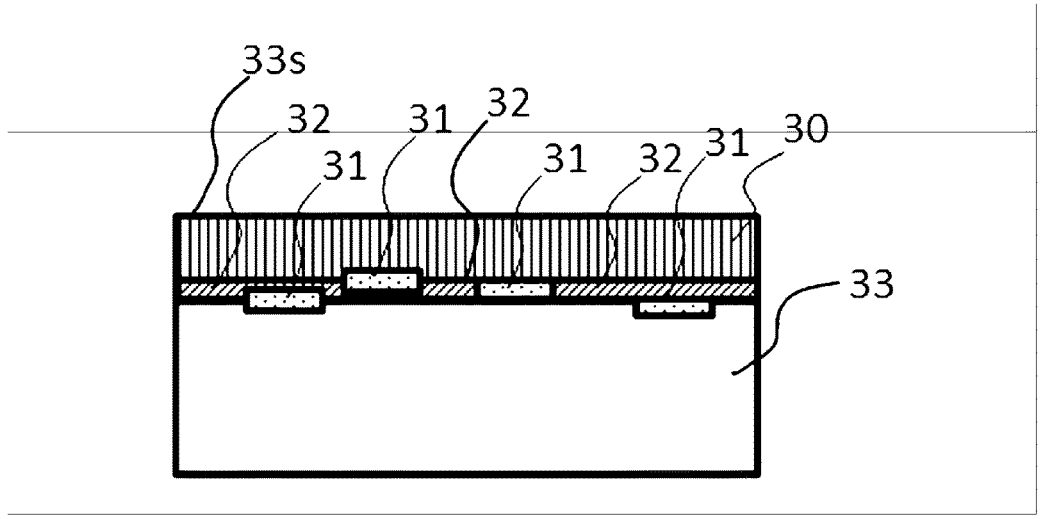
FIG. 1B is a schematic diagram showing the cross-section of an alumina substrate of the present embodiment, wherein gaps are formed to be touched or sandwiched by the laminar rare earth elements-containing regions.

FIG. 1A and FIG. 1B are schematic diagrams showing the cross-section of the alumina substrate of the present embodiment. FIG. 1A shows an example in which gaps 31 and rare earth element-containing regions 32 are formed in the interior of AlN layer 30 or at the interface between alumina substrate 33 and AlN layer 30. Each of gaps 31 and rare earth element-containing regions 32 can be disposed separately, and the adjacent gaps 31 and rare earth element-containing regions 32 can be in touch. FIG. 1B shows an example in which rare earth element-containing regions 32 are formed to be laminar, and gaps 31 are disposed to be touched or sandwiched by the laminar rare earth elements-containing layers 32. The laminar rare earth elements-containing layers 32 are disposed in the interior of AlN layer 30 or at the interface between alumina substrate 33 and AlN layer 30. By producing such a structure, stress, which is caused by lattice-mismatch and thermal expansion coefficient difference of alumina substrate 33 and AlN layer 30, can be concentrated in rare earth element-containing region 32. Just by the concentrated stress, stress applied to AlN layer 30 situated in the side closer to the surface than rare earth element-containing region 32 can be reduced, and warping in AlN layer 30 can be decreased. In addition, stress is released due to gaps 31, and thus warping can be decreased. Further, crack generated when excessive stress is applied during the growth of the AlN crystal is induced and propagated to rare earth element-containing region 32 and gap 31, so the AlN crystal can be separated from the alumina substrate without generating crack or fracture in the grown crystals.

The reason for the concentration of stress in rare earth element-containing region 32 will be described hereinafter. Generally speaking, when two substances with different lattice spacing are combined, stress will be produced because of the lattice-mismatch. Further, when thermal expansion coefficients are different even if their lattice spacings are the same, lattice spacing will change due to temperature fluctuation, so stress caused by lattice-mismatch also will be generated. Compared to the alumina substrate, AlN crystal can obtain larger lattice spacing, and the rare earth element-containing region will obtain much larger lattice spacing. Therefore, when rare earth element-containing region 32 is located between alumina substrate 33 and AlN layer 30 as shown in FIG. 1A and FIG. 1B, stress will be produced nearby the interface formed by alumina substrate 33 and rare earth element-containing region 32. Further, stress will also be produced nearby the interface of rare earth element-containing region 32 and AlN layer 30. That is, two kinds of stress are produced in rare earth element-containing region 32, and thus stress applied on rare earth element-containing region 32 is larger than that produced in AlN layer 30 in the case when only AlN layer 30 is formed on alumina substrate 33. Stress obtained from alumina substrate 33 will be offset just as much as the surplus stress produced in rare earth element-containing region 32, and warping of AlN layer 30 will be decreased.

When gaps 31 are disposed between alumina substrate 33 and AlN layer 30, crystal lattices of alumina substrate 33 and AlN layer 30 are not bound, so lattice-mismatch will not be generated, and warping can be decreased. On the other hand, the strength of the whole alumina substrate 33 will be decreased as gaps 31 are formed. In the case that such a substrate is used to carry out the growth of the AlN crystal, if lattice-mismatch stress caused by the growth of the crystal is excessive, crack will be generated and propagated due to gaps 31, and thus the grown crystal can be separated from the substrate. However, at the same time if the amount of gaps 31 is too high, crack or fracture will occur even if stress is small in degree of handling, and thus it is difficult to independently operate as a substrate. Additionally, if the amount of gaps is too small, fractures of the grown crystal will occur, and thus it is difficult to stably grow the AlN crystal.

The inventors of the present invention have found that the same effect as that produced by the gap can be achieved and the strength of substrate can be improved if the gap and the rare earth element-containing region are disposed in combination. Since the outermost surface layer of the alumina substrate of the present invention becomes AlN layer 30, the AlN crystal can be grown on the alumina substrate of the present invention with excellent matching. In addition, if excessive stress caused by lattice-mismatch between the AlN crystal and alumina substrate 33 as well as thermal expansion coefficient difference will be produced along with the growth of the AlN crystal, crack will also be generated and propagated not only by the gaps formed on the alumina substrate of the present invention but also by rare earth element-containing region 32 where stress is concentrated, and thus the grown crystal can be separated from the substrate without bringing damage to the grown crystal. Besides, the crystal lattice of rare earth element-containing region 32 binds with that of alumina substrate 33 and/or AlN crystal 30, so the strength of the whole alumina substrate of the present invention can be prevented from decreasing. Thereby, handling can be conducted in freedom, and various treatments can be subjected to the independent substrate.

Rare earth element-containing regions 32 and gaps 31 are preferred to be distributed along a surface approximately parallel to alumina substrate surface 33s. It is because that generation and propagation of crack, which is produced when the substrate is subjected to an excessive stress during growing the AlN crystal, is easily induced to a direction approximately parallel to alumina substrate surface 33s, and it is easy to prevent crack from entering the grown crystal. Further, the approximately parallel means that the height difference to the extent that crack propagation to the grown AlN crystal can be suppressed is an allowable level of parallelism.

The amount of the contained rare earth elements is 1 ppm or more and 10000 ppm or less, and more preferably 1 ppm or more and 1000 ppm or less based on Al element ratio. Thus, warping can be significantly reduced, and crack or fracture can be significantly prevented from occurring in the grown crystal when the AlN crystal is growing on the alumina substrate of the present invention.

The layer thickness of AlN layer 30 is 0.02 µm or more and 100 µm or less, and preferably 0.05 µm or more and 10 µm or less, and more preferably 0.2 µm or more and 1 µm or less. Thereby, warping can be remarkably reduced. Further, when the AlN crystal is grown on the alumina substrate of the present invention, crack or fracture in the grown crystal can be more significantly prevented from occurring.

The total length of rare earth element-containing region 32 along a direction approximately parallel to the alumina substrate surface is preferred to be 10% or more and 100% or less relative to the length in the direction approximately parallel to the alumina substrate surface. Thereby, warping can be remarkably reduced. Further, when the AlN crystal is grown on the alumina substrate of the present invention, crack propagation is easily induced in the direction approximately parallel to the alumina substrate surface, and thus crack or fracture in the grown crystal can be more significantly prevented from occurring.

The total length of gap 31 along a direction approximately parallel to the alumina substrate surface is preferred to be 10% or more and 60% or less relative to the length in the direction approximately parallel to the alumina substrate surface. Thereby, warping can be remarkably reduced. Further, when the AlN crystal is grown on the alumina substrate of the present invention, crack propagation is easily induced in the direction approximately parallel to the alumina substrate surface, and thus crack or fracture in the grown crystal can be more significantly prevented from occurring. Besides, the substrate can be operated without damage in the handling.

The total length of rare earth element-containing region 32 and gap 31 along a direction approximately parallel to the alumina substrate surface is preferred to be 50% or more and 100% or less relative to the length in the direction approximately parallel to the alumina substrate surface. Thereby, warping can be remarkably reduced. Further, when the AlN crystal is grown on the alumina substrate of the present invention, crack propagation is easily induced in the direction approximately parallel to the alumina substrate surface, and thus crack or fracture in the grown crystal can be more significantly prevented from occurring. Besides, the substrate can be operated without damage in the handling.

The thickness of rare earth element-containing region 32 and gap 31 in a direction perpendicular to the alumina substrate surface is preferably 50% or less relative to the thickness of AlN layer 30. Thereby, when growing the AlN crystal, crack propagation is easily induced in the direction approximately parallel to the alumina substrate surface, and thus crack or fracture in the grown crystal can be more significantly prevented from occurring.

When sapphire substrate is used, the formed AlN layer is required to be mainly composed of single crystal. In fact, it is preferred that 50% or more of the total area of the substrate turns to be single crystal, wherein the substrate is the base. Thereby, the cost can be reduced for the fabrication of the devices such as a light emitting device or a power transistor or the like where a semiconductor layer is laminated on a single crystal substrate.

Hereinafter, an example for fabricating an alumina substrate of the present embodiment is described. Also, an alumina substrate having the same structure as that of the present embodiment can be fabricated by alternative method.

Figure 2:
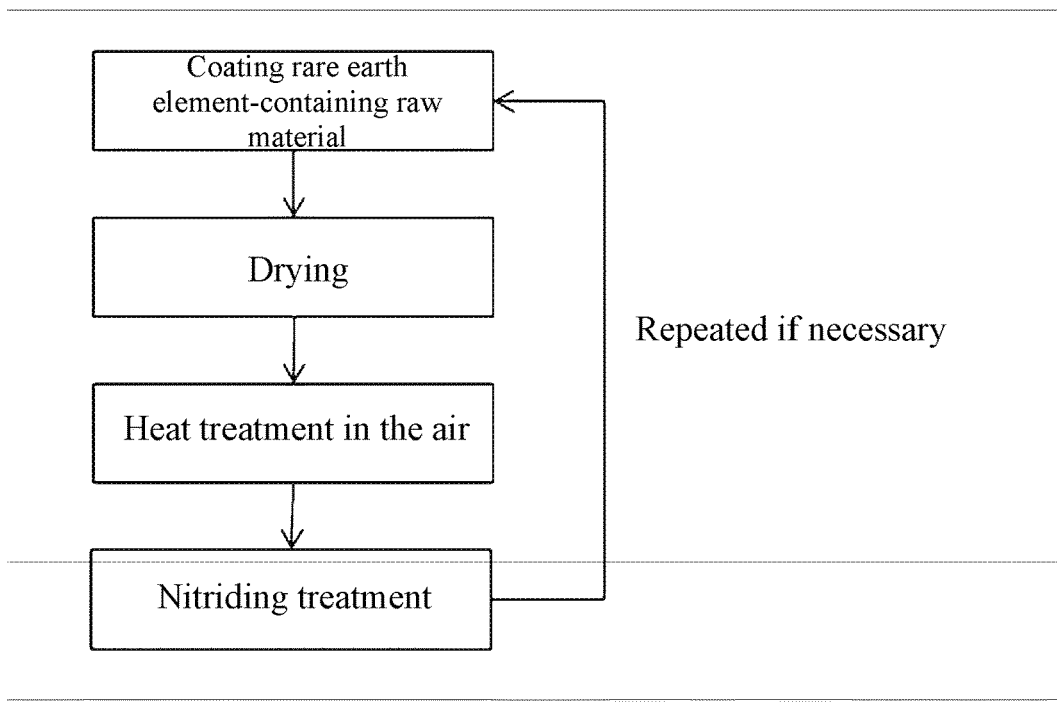
FIG. 2 is a diagram showing an example of a flow chart for fabricating an alumina substrate of the present embodiment.

FIG. 2 illustrates the fabrication flow. As the main process, it is composed of the following a) to d), i.e., a) a process of coating rare earth element-containing raw material on the alumina substrate which will be the base; b) drying process; c) a process of heat treatment for the coated substrate in the air; and d) nitriding treatment process. Further, these processes can be repeated.

Firstly, the raw material containing the rare earth elements is coated on the alumina substrate. The coating method is not particularly limited. The method can include vacuum method such as sputtering method, electroplating method, spraying method, spin-coating method or the like. In the present example, the raw material is coated by spin-coating method. In spin-coating method, a solution of raw material is required. Thus, the ethanol solution of nitrate of rare earth elements and MOD solution of rare earth elements manufactured by Kojundo Chemical Laboratory Co., Ltd. are used in the present example, and then spin-coated with a speed of 1000 to 3000 rpm for 20 to 120 minutes to form a coating layer. In addition, MOD solution is a solution where organic salts of the rare earth elements are dissolved in a solution with xylene as the main component.

Next, the heat treatment is subjected in the air. The temperature of the heat treatment depends on the species of rare earth element-containing salt, but it is preferred to be 500° C. to 1400° C., and more preferably to be 600° C. to 1000° C. In such a temperature range, the smoothness of the substrate surface can be maintained, and the coated solution can be heat-decomposed completely and can be oxidized regardless of whether it is an inorganic salt or an organic salt. The treated substrate can be used as nitrided substrate 10.

Figure 3:
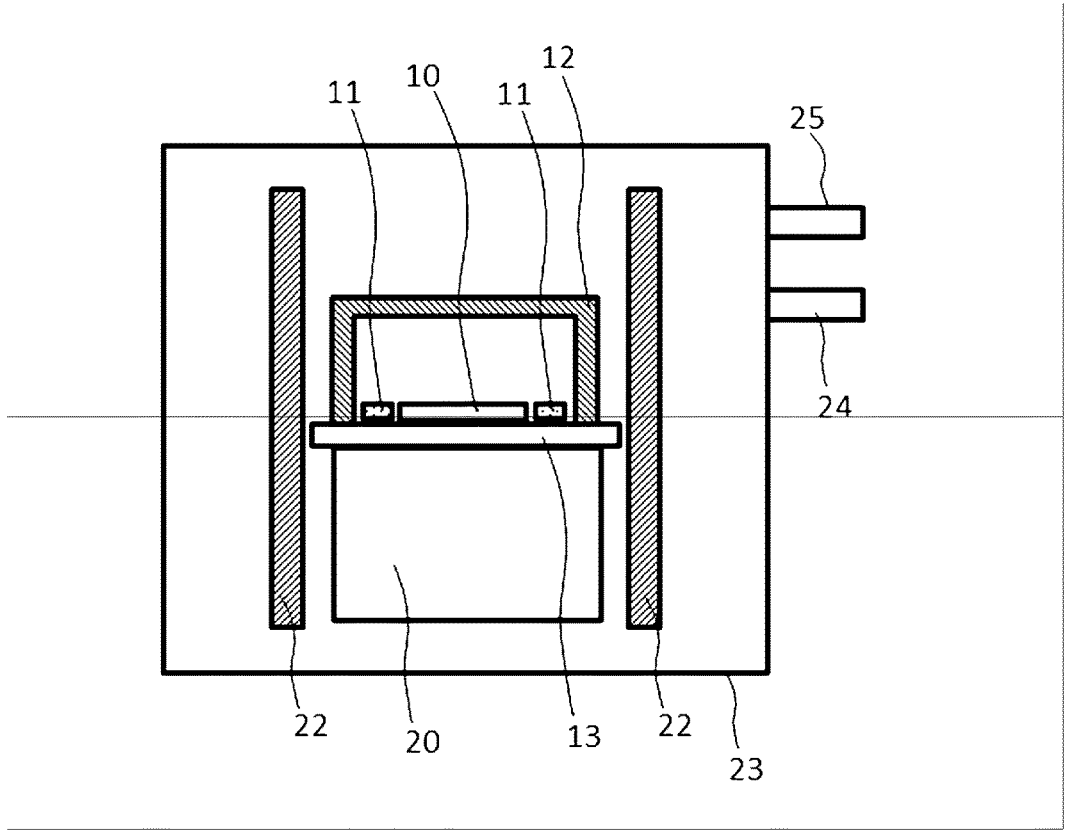
FIG. 3 is a schematic diagram showing the heating part during the nitriding process of the present embodiment.

Subsequently, the nitriding treatment is performed to form AlN layer 30. FIG. 3 is a schematic diagram showing a heating part of a nitriding furnace. The heating furnace is composed of carbon heater 22, sampling stage 20 and chamber 23 which covers the whole. In chamber 23, gas exhaust port 24 and gas intake port 25 are disposed. Gas exhaust port 24 is connected with a rotary pump (which is not shown in the figure) and a diffusion pump (which is not shown in the figure) and turns out to be a structure which can perform degassing. Further, through gas intake port 25, it turns out to be a structure which can introduce nitrogen gas.

Alumina plate 13 is disposed on the sampling stage, nitrided substrate 10 and carbon 11 are loaded on it. Further, at the same time, approximately hermetically-closed alumina saggar 12 is disposed on alumina plate 13 to cover the whole of nitriding treatment substrate 10 and carbon 11. Besides, the approximately hermetically-closed state doesn't refer to a sealing property which can block the gas flow entirely, but refers to a sealing property which can suppress the gas flow to some extent. Further, in the case that rare earth element-containing raw material is disposed during the nitriding treatment process, it is disposed to be covered by approximately hermetically-closed alumina saggar 12 just like carbon 11. Further, in the case that rare earth element-containing raw material or carbon is disposed to adhere to the holding jigs, it can be coated inside alumina plate 13 or approximately hermetically-closed alumina saggar 12.

The heating temperature depends on the rare earth elements, but it is about 1400 to 1800° C. If it is lower than this temperature, the AlN layer cannot be formed sufficiently. On the other hand, if the heating temperature is too high, alumina substrate used as the processed substrate will be deteriorated. Further, carbon 11 is disposed beside the substrate at that time. The amount of carbon 11 would be different according to the processed size and the processed condition, and thus it is not limited and is 0.1 mg or more. If it is too little, the nitriding treatment cannot be performed sufficiently and no or little AlN can be produced. Further, the crystallinity may also be decreased. If it is more than 0.1 mg, the excessive carbon cannot turn to be gas and maintain its original form; thus, it does not have much influence on AlN production. However, sometimes, the flatness of the substrate surface is decreased or different phase is precipitated, so the amount of carbon 11 needs to be adjusted according to the acceptable level.

Carbon 11 is disposed at the surrounding of nitrided substrate 10. The disposition method of carbon 11 and the form of carbon 11 are not particularly limited. Carbon 11 can be disposed at one place together, and also can be disposed dispersedly. In addition, the carbon can be coated on a holder of alumina saggar 12 or the like. Further, powder, block or rod-like carbon can be disposed.

According to such a treatment, AlN layer 30 can be formed on the alumina substrate surface. In the case of a sapphire substrate, the formed AlN layer 30 is formed follow the substrate orientation of the foundation. Further, AlN will be generated on the substrate surface even if no Al is contained in the coating raw material. Thus, the AlN is not formed to adhere to the alumina substrate surface but is formed by substituting the oxygen in the alumina substrate nearby the surface with nitrogen. On the other hand, the rare earth elements coated on the substrate surface will mostly disappear through a nitriding treatment. It is thought that they form nitrides or carbides and turn to be gas to disappear.

An alumina substrate with an AlN layer 30 formed on it without forming rare earth element-containing regions can also be fabricated by turning the entire coated rare earth elements into gas to remove them. The inventors of the present invention considers to left a part of rare earth elements as regions and thus lattice-mismatch stress will be concentrated there. Therefore, they try to remain a part of rare earth elements intentionally. As the result of trials and errors, it is found out that a part of rare earth elements can be remained as rare earth element-containing regions and a part of gasified rare earth elements-containing substance enters inside the alumina substrate of the present embodiment by controlling the thickness and density of the coated layer of the rare earth elements-containing substance, the heat treatment temperature, the nitriding treatment temperature, the duration and the atmosphere control and further adjusting the carbon amount. As a result, the present invention is completed.

In the present embodiment, the atmosphere is maintained by hermetically-closed heating furnace and approximately hermetically-closed alumina saggar 12, but it is not limited to this. It is considered that as long as the carbon amount and the rare earth elements amount can be controlled, an alumina substrate having the same structure as that of the present embodiment can be obtained even if the heating part is in a gas flow or in an open environment.

Figure 5A:
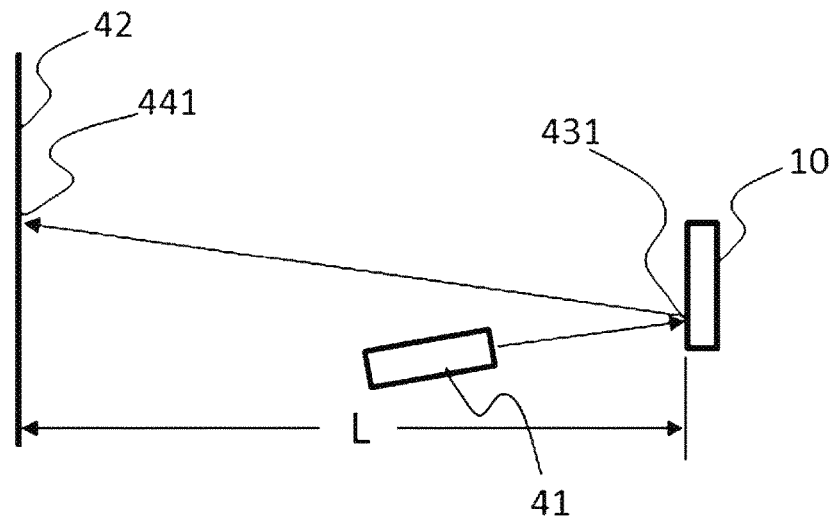
FIG. 5A is a schematic diagram showing the first measuring system which will be the reference in the measuring method for the curvature radius of the alumina substrate in the present embodiment.
Figure 5B:
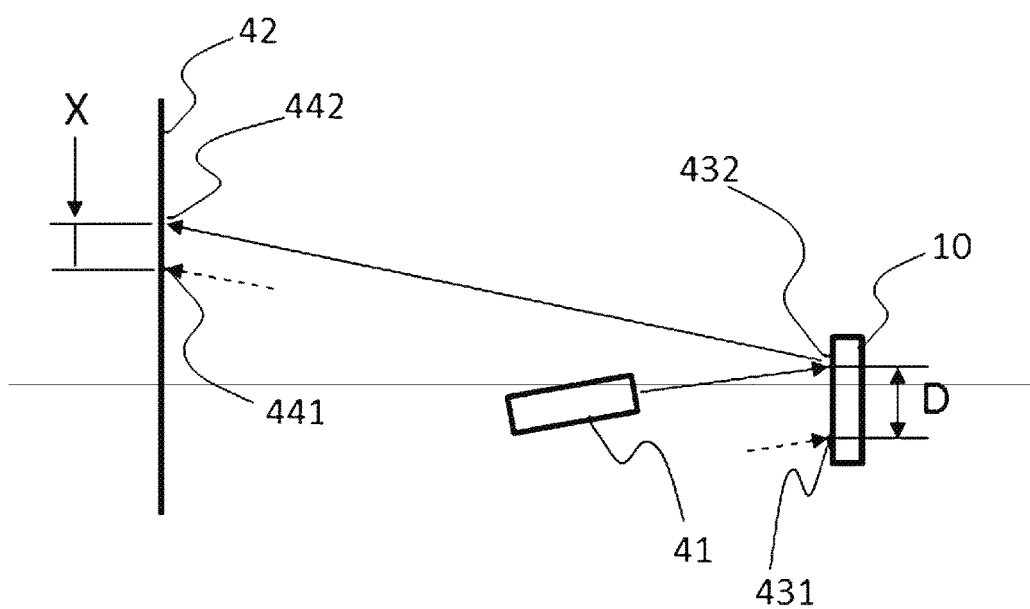
FIG. 5B is a schematic diagram showing the optical measuring system after the moving of the irradiation position in the measuring method for the curvature radius of the alumina substrate in the present embodiment.

Warping can be evaluated by calculating the curvature radius through a method using surface reflected light. It is described using FIG. 5A and FIG. 5B. Light is irradiated from visible LD or LED light source 41 to arbitrary point 431 on the side formed with AlN layer of nitrided substrate 10 of the present embodiment. The reflected light forms an image on screen 42 and image position 441 is marked. Subsequently, (as shown in FIG. 5A) nitrided substrate 10 is moved only with a distance D in a direction parallel to the screen in a state with the optical system fixed, the irradiation position is changed to position 432. In the same way, the reflected light from irradiation position 432 forms an image on the screen and image position 442 is marked. The distance between the two image positions 441 and 442 is deemed as the displacement X (as shown in FIG. 5B). Further, the distance of nitrided substrate 10 and screen 42 is set as L, and the curvature radius of warping of nitrided substrate 10 is set as R. If L and R are sufficiently larger than D and X, curvature radius R can be approximately calculated by the following formula.

$$R = 2LD/X$$

Further, if the displacement vector of irradiation position 432 with irradiation position 431 being the start point and the displacement vector of image position 442 with image position 441 being the start point are parallel, warping of alumina substrate 10 is convex. If they are antiparallel, warping of alumina substrate 10 is concavity.

EXAMPLES

Example 1

Figure 4A:
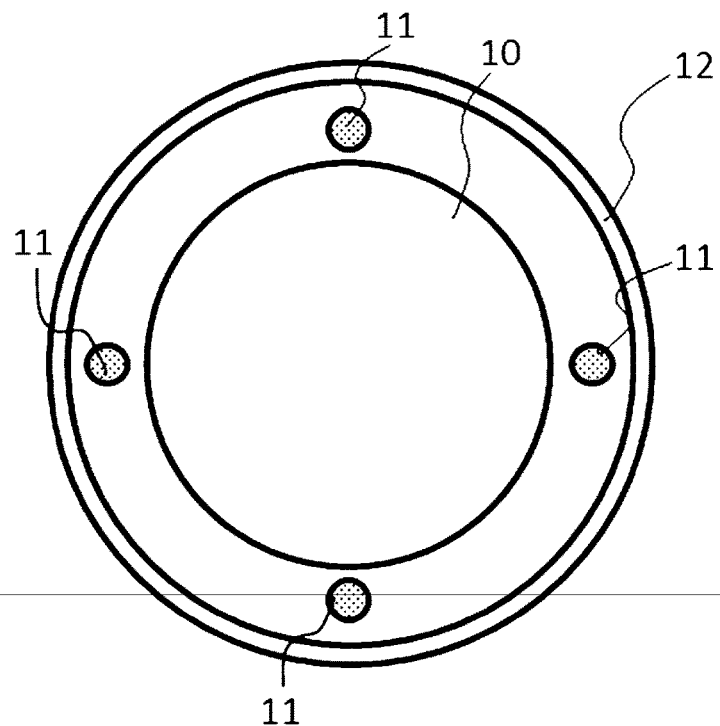
FIG. 4A is a plain view showing a disposition of nitrided substrate and carbon of the present embodiment in Example 1.

MOD solution was coated on c-plane sapphire substrate with a 4 size of 2 inches by spin coating method under 2000 rpm for 20 seconds, wherein the MOD solution contained Y as the rare element with a concentration of 2 wt %. After coated, the substrate was dried on a hotplate of 150° C. for 10 minutes. Then it was heat treated in air for 2 hours under 600° C. After the heat treatment, the substrate was put on alumina plate 13 with 100 mm square. Further, powder like carbon 11 was disposed in four places around substrate 10 with 20 mg in each place and a total amount of 80 mg. After that, alumina saggar 12 with 75 mm square and a height of 70 mm covered them all. Then, they were set on sampling stage 20. These processes were shown in FIG. 3 and FIG. 4A. The nitriding furnace was an electric furnace of resistance heating type with carbon as the heater. Before heating, degassing was performed using a rotary pump and a diffusion pump to 0.03 Pa, and then nitrogen gas was flowed into the saggar to obtain a pressure of 100 kPa (atmospheric pressure) and after that the flow of nitrogen gas was stopped. The treating temperature of the nitriding treatment was 1750° C., the treating time was set to be 12 hours, and the heating and cooling rate were set as 600° C./h. Further, gas exhaust port 24 were properly opened or closed, and then the pressure in the chamber was adjusted to be 250 kPa at the treating temperature. After cooled to the room temperature, the treated substrate was taken out to evaluate.

A 10 mm square sample cut out from the vicinity of the center part was used to perform a XRD measurement using Cu as the target. The result confirmed the AlN (002) diffraction ray and thus it could be confirmed as a single crystal or an alignment film along the c axis. On the other hand, crystal phase containing Y could not be found. Further, the intensity ratio of the AlN (002) diffraction ray relative to the sapphire (006) diffraction ray was 65%. Six peaks of six-fold symmetry axis were found in the pole figure measurement using (112) plane and thus it could be confirmed to be a single crystal.

Figure 6A:
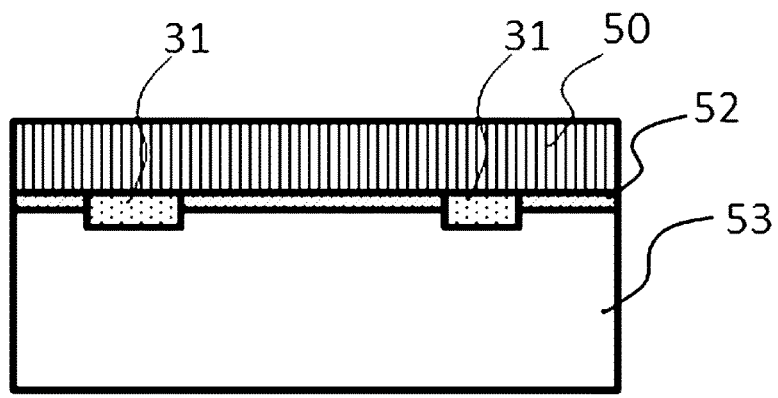
FIG. 6A is a schematic diagram showing SEM observation for backscattered electron image of FIB processed cross section of the alumina substrate of the present embodiment in Example 1.

The curvature radius of the sample was measured using an optical system as shown in FIG. 5A and FIG. 5B. It could be known from the result that the curvature radius was 75 m, and AlN layer forming surface side was convex. Further, the amount of the rare earth element was analyzed using X-ray fluorescence method from AlN layer forming surface side. As a result, 140 ppm of Y atom relative to Al atom number was detected. Subsequently, the cross-section near the center part was FIB processed and then backscattered electron image of SEM was observed. The morphology was schematically shown in FIG. 6A. In the result, a layered white-light-emitting region 52 was observed to be sandwiched by first crystal 50 with a thickness of 0.4 μm and second crystal 53. Besides, in the visual field with a length of 10 μm, two gaps 31 were observed with being sandwiched by layered white-light-emitting region 52. Both the gaps were roughly rectangular, and the gaps respectively had a shape of length being 1.0 μm and thickness being 0.04 μm and a shape of length being 0.8 μm and the thickness being 0.04 μm. Here, the direction parallel to the substrate surface was taken as length, and the vertical direction was taken as the thickness.

From the result of XRD, it was discovered that first crystal 50 was AlN crystal. Further, it could be confirmed that white-light-emitting region 52 contained elements with larger atomic weight than Al element in view of the property of the backscattered electron image. If the elements used in the treating process were taken into consideration, the element with larger atomic weight than Al element was considered to be Y Further, it was confirmed to be Y by EPMA. In addition, the elements in first crystal 50 and second crystal 53 were also analyzed by EPMA. Thus, first crystal 50 was confirmed to be AlN layer, and second crystal 53 was confirmed to be alumina respectively.

It could be confirmed from the result of SEM observation that rare earth element-containing regions 32 occupied 82%, gaps 31 occupied 18%, and the total length of rare earth element-containing regions 32 and gaps 31 occupied 100% relative to 10 µm of the length direction. In addition, it was known that rare earth element-containing regions 32 and gaps 31 were disposed to be approximately parallel to the substrate surface and the thickness of rare earth element-containing regions 32 and gaps 31 was 10% relative to that of AlN layer 30.

Example 2

In the 10 mm square samples cut out from Example 1, a sample in the vicinity of the outer circumferential part was performed with XRD measurement, SEM observation and EPMA measurement. In XRD measurement, the result was the same as in Example 1. An AlN (002) diffraction ray was observed and the intensity ratio of AlN (002) diffraction ray relative to sapphire (006) diffraction ray was 55%. Six peaks of six-fold symmetry axis were found in the pole figure measurement using (112) plane and thus the sample could be confirmed to be a single crystal. The curvature radius was 110 m. Further, in the X-ray fluorescence method, 180 ppm of Y atom relative to Al atom number was detected. If compared to Example 1, it was found that if the content of rare earth elements was increased, the curvature radius would be bigger, i.e., warping would be smaller.

Figure 6B:
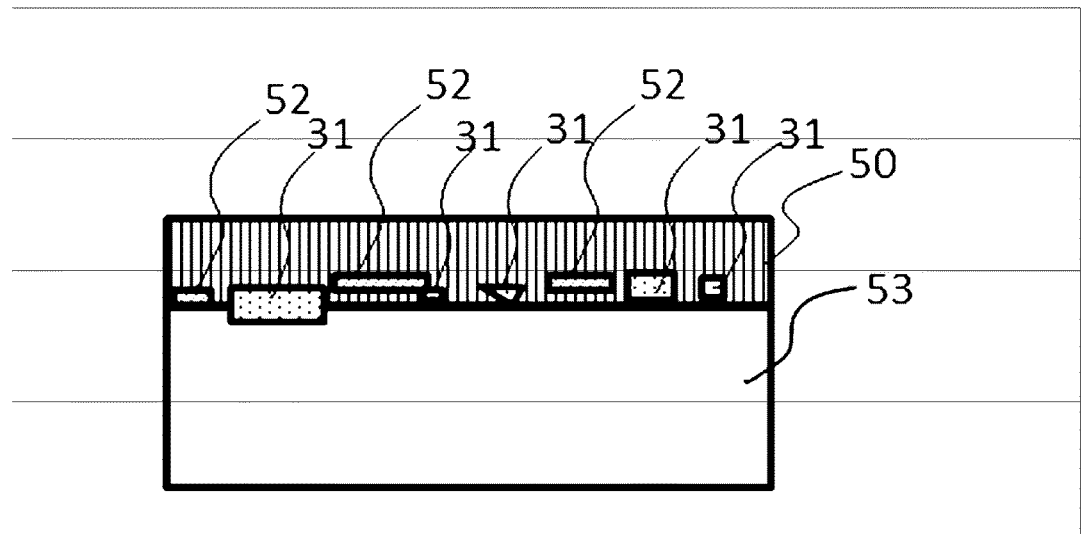
FIG. 6B is a schematic diagram showing SEM observation for backscattered electron image of the FIB processed cross section of the alumina substrate of the present embodiment in Example 2.

The observed result from the backscattered electron image of SEM was schematically shown in FIG. 6B. White-light-emitting regions 52 and gaps 31 were observed at the interface of first crystal 50 with a thickness of 0.5 µm and second crystal 53 as well as in the interior of first crystal 50 nearby the interface. White-light-emitting regions 52 were not layered, and three regions were found in an independent form in 10 µm length of the visual field. Among the length of the regions, the maximum length was 1 µm, and the minimum length was 0.4 µm. All the thickness was 0.02 µm. On the other hand, five gaps 31 were observed. Among the length of gaps 31, the maximum length was 1 µm, and the minimum length was 0.2 µm. Besides, the maximum thickness was 0.4 µm and the minimum thickness was 0.1 µm. It was found that the shapes of gaps were approximately rectangular or approximately triangular. Here, the direction parallel to the substrate surface was taken as length, and the vertical direction was taken as the thickness.

It was confirmed that white-light-emitting regions 52 were rare earth element-containing regions 32 by the same method as that in Example 1. It could be confirmed from the result of SEM observation that rare earth element-containing regions 32 occupied 28%, gaps 31 occupied 25%, and the total of rare earth element-containing regions 32 and gaps 31 occupied 53% relative to 10 µm of the length direction. In addition, it was known that rare earth element-containing regions 32 and gaps 31 were disposed to be approximately parallel to the substrate surface and even the maximum thickness of rare earth element-containing regions 32 and gaps 31 was 8% relative to that of AlN layer 30.

Example 3

One of 10 mm square samples cut from the vicinity of the center part which was the same in Example 1 was used as the substrate to grow AlN single crystal by a flux method. The flux method was performed by the following conditions. Materials (with a composition as follows, i.e., Si: 35.7 wt %, C: 2.3 wt %, Al: 62.0 wt %, weight: 150 g) were added into a crucible made from yttria-stabilized zirconia and then the crucible was put into the heating region of a high-frequency heating furnace. A stirring jig made from yttria-stabilized zirconia was disposed just above the material, wherein a nitrided sapphire substrate was fixed on the stirring jig. The temperature of the materials in the nitrogen atmosphere was heated to 1600° C. to melt the materials. Then the solution was saturated with nitrogen while stirred by stirring impellers for 5 hours. After that, the nitrided sapphire substrate was contacted to the surface of the solution and rotated at the speed of 100 rpm. At the same time, the temperature of the materials was decreased slowly to grow an AlN single crystal on the sapphire substrate using 20 hours. After the crystal growth was completed, the sapphire substrate was kept away from the solution and the materials were cooled to the room temperature. After being cooled, the sample was taken out from the furnace. It was found that the alumina substrate was peeled in the horizontal direction and the AlN single crystal plate was separated from the part of the sapphire substrate. It was considered that in the growth of the AlN crystal, the rare earth element-containing region withstood the concentrated stress generated by lattice-mismatch and as a result it was peeled spontaneously. The thickness of the AlN single crystal plate was 250 µm.

Example 4

One of 10 mm square samples cut from the vicinity of the center part which was the same in Example 2 was used as the substrate to grow AlN single crystal by the flux method. The conditions of the flux method were the same as those in Example 3. The sample was taken out from the furnace after being cooled. As a result, the alumina substrate was peeled in the horizontal direction and the AlN single crystal plate was separated from the part of the sapphire substrate. It was considered that in the growth of the AlN crystal, the rare earth element-containing region withstood the concentrated stress generated by lattice-mismatch and as a result it was peeled spontaneously. The thickness of the AlN single crystal plate was 250 µm.

Example 5

Figure 4B:
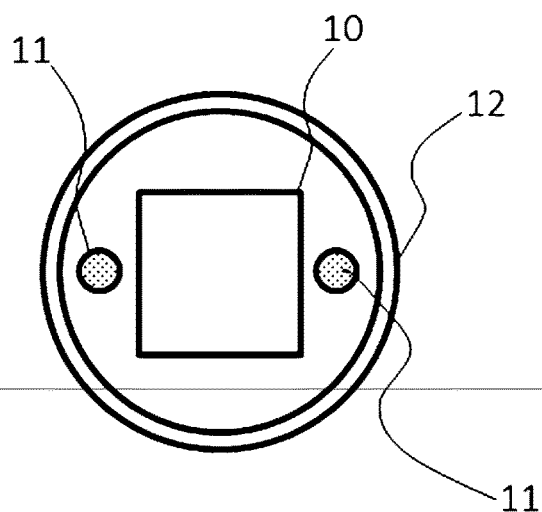
FIG. 4B is a plain view showing a disposition of nitrided substrate and carbon of the present embodiment in Examples 5 and 6.

The c-plane sapphire was cut into 10 mm square to prepare substrate 10 for nitriding treatment. Neodymium (III) nitrate hydrate was dissolved in ethanol to obtain a concentration of 2 wt %. After that, some surfactant was added to fabricate a coating solution. The spin coating was performed under 3000 rpm for 20 seconds. After dried on a hotplate of 250° C. for 10 minutes, the sample was performed with a heat treatment in air for 2 hours under 600° C. After heat treatment, it was disposed on alumina plate 13 with 100 mm square, and further 500 mg of block like carbon 11 was disposed on the two lateral places of substrate 10. The disposition figure was shown in FIG. 4B. A cylindrical alumina crucible with a diameter of 30 mm and a height of 30 mm was used as the approximately hermetically-closed alumina saggar 12. The approximately hermetically-closed state was realized by inverting the alumina crucible and covering substrate 10 and block like carbon 11. The nitriding treatment was performed in the same way as Example 1.

In XRD measurement, an AlN (002) diffraction ray was discovered, and the intensity ratio of AlN (002) diffraction ray relative to sapphire (006) diffraction ray was 20%. According to SEM observation of backscattered electron image for the FIB processed cross-section, the thickness of first crystal 50 was 0.15 μm and white-light-emitting region 52 with a thickness of about 0.02 μm was observed. Four gaps with the length of about 0.5 μm and the thickness of about 0.02 μm were found out in the visual field with the length of 10 μm and they were sandwiched by the layered white-light-emitting region 52. Nd atom was contained in the content of 100 ppm based on Al atom number ratio. The curvature radius was 77 m. It was determined according to the results of XRD measurement, SEM observation and EPMA that first crystal 50 was AlN layer, second crystal 53 was alumina, and Nd was contained in the layered white-light-emitting region 52.

Comparative Example 1

Same treatment was performed in the same way as Example 5 except that a cylindrical alumina crucible with a diameter of 60 mm and a height of 50 mm was used as alumina saggar 12 and the pressure in the chamber was set to be 10 kPa. As a result, the intensity ratio of AlN (002) diffraction ray relative to sapphire (006) diffraction ray was 15%, and the thickness of first crystal 50 was 0.12 μm. If compared with Example 5, the intensity of AlN (002) diffraction ray decreased and the thickness of first crystal became thinner. On the other hand, the curvature radius was 15 m, no Nd was detected, and further no gaps were observed. According to the comparison between Example 5 and Comparative Example 1, it could be known that the curvature radius of the alumina substrate in the present embodiment would be larger, i.e., warping would be smaller by containing rare earth elements and gaps.

Example 6

The c-plane sapphire was cut into 10 mm square to prepare substrate 10 for nitriding treatment. The MOD solution containing Eu as the rare earth element with a concentration of 2 wt % was coated by a spin-coating method with a speed of 2000 rpm for 20 seconds. After coating, the substrate was dried on the hot plate with a temperature of 150° C. for 10 minutes. After that, it was subjected to a heat treatment at 600° C. for 2 hours in the air. The nitriding treatment was performed in the same way as Example 5 except the treating temperature was set to be 1600° C.

In XRD measurement, an AlN (002) diffraction ray was discovered, and the intensity ratio of AlN (002) diffraction ray relative to sapphire (006) diffraction ray was 32%. According to SEM observation for FIB processed cross-section, the thickness of first crystal 50 was 0.2 μm and white-light-emitting region 52 was present in layer. It was confirmed that the thickness of white-light-emitting region 52 was about 0.02 μm. Further, two gaps with the length of about 0.8 μm to 1.5 μm and the thickness of about 0.02 μm were found in the visual field with the length of 10 μm and they were sandwiched by the layered white-light-emitting region 52. The curvature radius was 35 m. In addition, Eu atom was contained in the content of 50 ppm based on Al atom number ratio. It was determined according to the results of XRD measurement, SEM observation and EPMA that first crystal 50 was AlN layer, second crystal 53 was alumina, and Eu was contained in the layered white-light-emitting region 52.

The alumina substrate of the present invention not only can be used as a substrate for growing single crystal such as AlN or the like, but also can be used in a substrate for light emitting element and semiconductor element, or a substrate of the product in the field which using the high thermal conductivity of AlN.

Further, the alumina substrate of the present invention itself can also be used directly as long as the utility value in industry was not damaged. That is, as long as the amount of the contained rare earth elements is in the allowed range, the alumina substrate can also be used as a high thermal conductivity substrate, a substrate for surface acoustic wave or a piezoelectric substrate.

DESCRIPTION OF REFERENCE NUMERALS

10 nitrided substrate
11 carbon
12 alumina saggar
13 alumina plate
20 sampling stage
22 carbon heater
23 chamber
24 gas exhaust port
25 gas intake port
30 AlN layer
31 gap
32 rare earth element-containing region
33 alumina substrate
33s alumina substrate surface
41 visible LD or LED light source
42 screen
431 the irradiation position of the light in an arbitrary point on the side formed with AlN layer of nitrided substrate 10 of the present embodiment
432 the irradiation position of the light after nitrided substrate 10 of the present embodiment is moved parallel to screen 42
441 the imaging position of the reflected light imaged on the screen corresponding to irradiation position 431 of the light
442 the image position of the reflected light imaged on the screen corresponding to irradiation position 432 of the light
50 first crystal
52 white-light-emitting region
53 second crystal

What is claimed is:
1. An alumina substrate comprising:
an alumina substrate base;
an AlN layer formed on a surface of the alumina substrate base, and
a plurality of spaced rare earth element-containing regions and a plurality of spaced gaps in an interior of the AlN layer or at an interface between the AlN layer and the alumina substrate base;
wherein the plurality of spaced rare earth element-containing regions are spaced from each other in a direc- tion of the interface between the AlN layer and the alumina substrate base and dispersed among the plurality of spaced gaps.

2. The alumina substrate according to claim 1, wherein a content of the rare earth element is 1~10000 ppm based on Al element ratio.

3. The alumina substrate according to claim 2, wherein a thickness of the AlN layer is 0.02 μm to 100 μm.

4. The alumina substrate according to claim 3, wherein the alumina substrate is sapphire.

5. The alumina substrate according to claim 4, wherein the AlN layer is mainly composed of a single crystal.

6. The alumina substrate according to claim 2, wherein the alumina substrate is sapphire.

7. The alumina substrate according to claim 6, wherein the AlN layer is mainly composed of a single crystal.

8. The alumina substrate according to claim 1, wherein a thickness of the AlN layer is 0.02 μm to 100 μm.

9. The alumina substrate according to claim 8, wherein the alumina substrate is sapphire.

10. The alumina substrate according to claim 9, wherein the AlN layer is mainly composed of a single crystal.

11. The alumina substrate according to claim 1, wherein the alumina substrate is sapphire.

12. The alumina substrate according to claim 11, wherein the AlN layer is mainly composed of a single crystal.

13. The alumina substrate according to claim 1, wherein the alumina substrate is formed by:
coating a raw material containing a rare earth element on the alumina substrate base;
drying the alumina substrate base coated with the raw material containing the rare earth element;
heat treating the alumina substrate base coated with the raw material containing the rare earth element at a temperature between 500° C. to 1400° C.; and
nitride treating the alumina substrate base coated with the raw material containing the rare earth element at a temperature between 1400° C. and 1800° C. to form the AlN layer.

14. The alumina substrate according to claim 1, wherein, when viewed in two dimensions from above, the length of the rare earth element-containing regions is between 10%-100% of the length of the alumina substrate base in the same direction.

15. The alumina substrate according to claim 1, wherein, when viewed in two dimensions from above, the length of the gaps is between 10%-60% of the length of the alumina substrate base in the same direction.

16. The alumina substrate according to claim 1, wherein, when viewed in two dimensions from above, the lengths of the rare earth element-containing regions and the gaps are between 50%-100% of the length of the alumina substrate base in the same direction.

17. The alumina substrate according to claim 1, wherein, when viewed in two dimensions from the side, the thickness of the rare earth element-containing regions and the gaps is less than 50% of the thickness of the AlN layer.

18. The alumina substrate according to claim 1, wherein the plurality of spaced rare earth element-containing regions and the plurality of spaced gaps are closer to the interface between the AlN layer and the alumina substrate base than to a surface of the AlN layer opposite to the interface between the AlN layer and the alumina substrate base.

* * * * *